United States Patent

Yamakawa et al.

[11] Patent Number: 5,099,213
[45] Date of Patent: Mar. 24, 1992

[54] PHASE-LOCKED OSCILLATOR WITH PHASE LOCK DETECTION CIRCUIT

[75] Inventors: Kunio Yamakawa; Shigeharu Sumi, both of Gifu, Japan

[73] Assignee: Matsushita Electric Industrial Co., Ltd., Japan

[21] Appl. No.: 465,162

[22] PCT Filed: Jun. 14, 1989

[86] PCT No.: PCT/JP89/00593

§ 371 Date: Apr. 2, 1990

§ 102(e) Date: Apr. 2, 1990

[87] PCT Pub. No.: WO89/12930

PCT Pub. Date: Dec. 28, 1989

[30] Foreign Application Priority Data

Jun. 15, 1988 [JP] Japan .................. 63-145679
Jun. 15, 1988 [JP] Japan .................. 63-145680

[51] Int. Cl.⁵ .................................. H03L 7/12
[52] U.S. Cl. .................................. 331/4; 331/25; 331/DIG. 2
[58] Field of Search .............. 331/4, 25, DIG. 2

[56] References Cited

U.S. PATENT DOCUMENTS 4,121,166 10/1978 Matsumoto et al. .......... 331/4 X
4,788,512 11/1988 Hogge, Jr. et al. ............ 331/4

Primary Examiner—Siegfried H. Grimm
Attorney, Agent, or Firm—Ratner & Prestia

[57] ABSTRACT

The invention relates to a phase-locked oscillator for communication apparatus and the like, and provides a phase lock detection circuit which can positively perform the phase lock detection. In order to accomplish this object, the output of a loop filter (2) is supplied to a first level detector (5) and also to an amplitude detector (6). The output of the amplitude detector (6) is supplied to a second level detector (7). A switching means (8) performs the switching operation in accordance with the output of the second level detector (7) to select an output from the first level detector (5) or a LOW level, and the selected one is output as a phase lock detection signal.

2 Claims, 5 Drawing Sheets

PHASE-LOCKED OSCILLATOR WITH PHASE LOCK DETECTION CIRCUIT

TECHNICAL FIELD

This invention relates to a phase-locked oscillator for use as a local oscillator or the like.

BACKGROUND ART

A phase-locked oscillator is compact and has low phase noise and low spurious signal output, and because of these characteristics it is often used as a local oscillator.

In an apparatus in which a phase-locked oscillator is employed as a local oscillator for frequency conversion, it is generally so designed that, if operation is out of phase, the apparatus stops functioning. For this purpose, it is essential to accurately determine whether operation is out of phase or not.

Therefore, a conventional phase-locked oscillator has an arrangement as illustrated in FIG. 7.

That is, an input signal applied to a reference signal input terminal 9 is compared in phase with an output of a voltage-controlled oscillator 4 by a phase comparator 1. An output of the phase comparator 1 is input to a loop filter 2. An output from the loop filter 2 is branched into two, one of which is input to the voltage-controlled oscillator 4, while the other is supplied to a sweep oscillator 3. An output from the sweep oscillator 3 is input to the loop filter 2. An output from the voltage-controlled oscillator 4 is branched into three so that they are respectively input to a band-pass filter 17, the phase comparator 1, and an oscillation output terminal 11. An output of the band-pass filter 17 is input to an amplitude detector 18, and an output of the amplitude detector 18 is input to a level detector 19. In turn, a phase lock detection signal is derived from a phase lock detection signal terminal 10 of the level detector 19. Thus, if the frequency of an oscillation output signal happens to deviate from a predetermined value, the oscillation output signal cannot pass through the band-pass filter 17, and accordingly the level of the output from the amplitude detector 18 is lowered. The fall in the output level is detected by the level detector 19, and on the basis of the detection an output signal for stopping the operation of the apparatus is issued from the phase lock detection signal terminal 10.

In such an arrangement, however, there has been a problem that, even if an out-of-phase phenomenon occurs, this cannot be detected in some cases. More particularly, when the output frequency of the voltage-controlled oscillator 4 in synchronous or phase-locked state deviates by a small degree from that in out-of-phase state, it is difficult to judge the occurrence of the out-of-phase state, since the frequency of the output signal from the voltage-controlled oscillator 4 is within the band of the band-pass filter 17 even when it is out of phase. In order to overcome such difficultly, it may be conceivable to narrow the band of the band-pass filter 17; but an attempt to narrow the band in a high-frequency zone has its limit, resulting in that this problem remains to be solved.

DISCLOSURE OF INVENTION

This invention has been conducted for solving this problem, and an object of the invention is to enable reliable detection of phase-locked condition. In order to accomplish this object, the invention provides a phase-locked oscillator comprising: a reference signal input terminal; a phase comparator, a first input terminal of said phase comparator being connected to said reference signal input terminal; a loop filter, an input terminal of said loop filter being connected to an output terminal of said phase comparator; a sweep oscillator connected between an output terminal of said loop filter and said input terminal of said loop filter, a voltage-controlled oscillator, an input terminal of said voltage controlled oscillator being connected to said output terminal of said loop filter; an oscillation output terminal connected to an output terminal of said voltage-controlled oscillator and to a second input terminal of said phase comparator; a connecting means for connecting said oscillation output means with a second input terminal of said phase comparator; a first level detector and an amplitude detector, an input terminal of each of said first level detector and amplitude detector being connected to said output terminal of said loop filter; a second level detector, an input terminal of said second level detector being connected to an output terminal of said amplitude detector; and a switching means for switching the state between first and second states in accordance with the output of said second level detector, said switching means connecting an output terminal of said first level detector to a phase lock detection signal terminal when said switching means switches the state to said first state, and connecting said phase lock detection signal terminal to a ground when said switching means switches the state to said second state, whereby a phase-lock detection signal can be reliably obtained.

BEST MODE FOR CARRYING OUT THE INVENTION

Embodiments of the invention will now be described with reference to the accompanying drawings.

Figure 1:
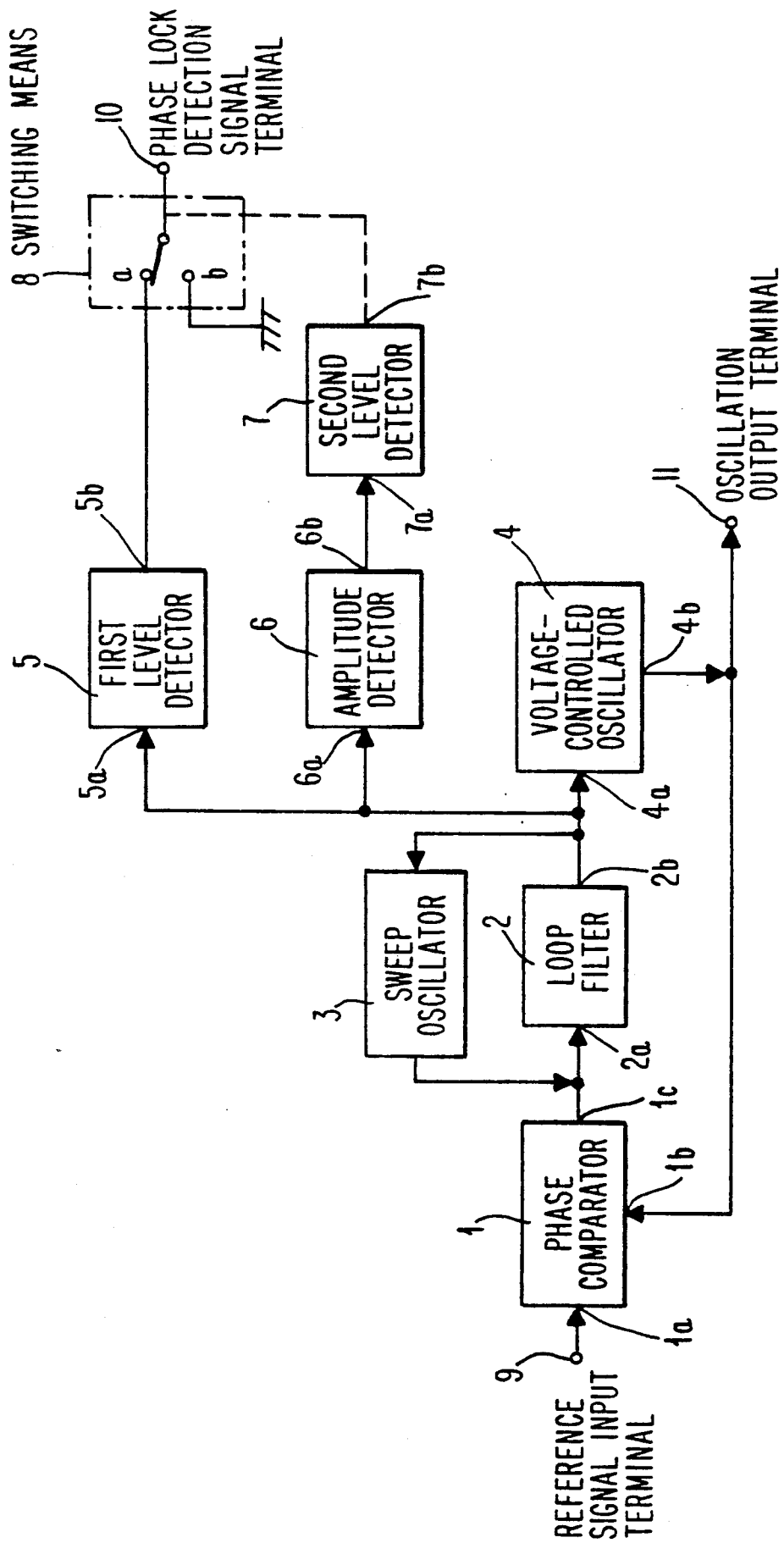
FIG. 1 is a block diagram showing a phase-locked oscillator representing a first embodiment of the invention.
Figure 2:
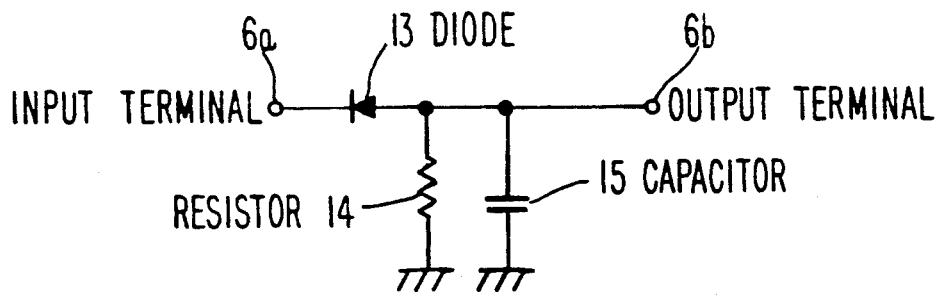
FIG. 2 is a circuit diagram showing an amplitude detector circuit employed in the phase-locked oscillator of the first embodiment of the invention.

FIG. 1 illustrates a first embodiment of the invention. Reference numeral 1 designates a phase comparator which compares the phase of an input signal input from a reference signal input terminal 9 to a first input terminal 1a with that of an input signal input from an output terminal 4b of a voltage-controlled oscillator 4 to a second input terminal 1b. 2 denotes a loop filter which removes noise and high frequency components from an input signal supplied to its input terminal 2a from an output terminal 1c off the phase comparator 1 and outputs a resulting signal from its output terminal 2b. 3 denotes a sweep oscillator which is interposed between the output terminal 2b and input terminal 2a of the loop filter 2 so that a sweep signal is applied to an input terminal 4a of the voltage-controlled oscillator 4 when an out-of-phase condition occurs. 5 is a first level detector which has an input terminal 5a connected to the output terminal 2b of the loop filter 2, and outputs a LOW signal from an output terminal 5b when the control voltage at the voltage-controlled oscillator 4 is a positive supply voltage and a HIGH signal when the control voltage is lower than the positive supply voltage. 6 is an amplitude detector which has an input terminal 6a connected to the output terminal 2b of the loop filter 2 and detects the amplitude of a negative voltage. The amplitude detector 6 is specifically shown in FIG. 2, in which 6a designates an input terminal, 13 designates a detecting diode, 14 designates a resistor, 15 designates a capacitor, and 6b designates an output terminal. 7 is a second level detector which outputs a LOW signal from an output terminal 7b when an input signal supplied to an input terminal 7a from the output terminal 6b of the amplitude detector 6 is negative, and a HIGH signal when the input signal is 0 V or positive. 8 is a switching means for selecting a LOW level when the output from the second level detector 7 is LOW (by grounding a phase lock detection signal terminal 10 via a terminal b), and for selecting the output of the first level detector (by connecting the output terminal 5b of the first level detector 5 to the phase lock detection signal terminal 10 via a terminal a), when the output from the second level detector 7 is HIGH.

The switching means 8 may be composed by an FET.

Then, the operation will be described. When the state is in a synchronous or phase-locked condition, a control voltage input to the input terminal 4a of the voltage-controlled oscillator 4 attains a DC value between 0 V and the positive supply voltage, and accordingly the output of the first level detector 5 is HIGH. In this state, the output of the first amplitude detector 6 is of 0 V, and the output of the second level detector 7 is HIGH. Accordingly, the switching means 8 selects the terminal a so that the HIGH output of the first level detector 5 becomes a phase lock detection signal. As long as the phase lock detection signal remains HIGH, the apparatus continues to operate.

An asynchronous or out-of-phase state occurs in the following three cases: firstly when the voltage-controlled oscillator 4 is in a sweep state; secondly when the output frequency of the voltage-controlled oscillator 4 deflects toward the higher side of frequency when the center frequency; and thirdly when the output frequency of the voltage-controlled oscillator 4 deflects toward the lower side of frequency than the center frequency.

Figure 3A:
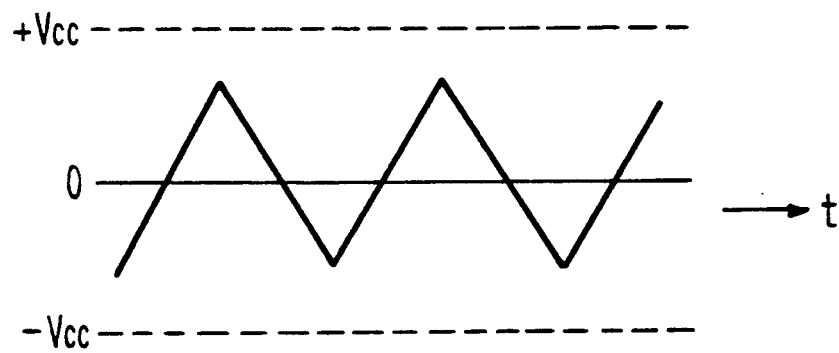
FIGS. 3a and 3b are waveform diagrams of input and output signals of the amplitude detector circuit employed in the phase-locked oscillator of the first embodiment of the invention.
Figure 3B:
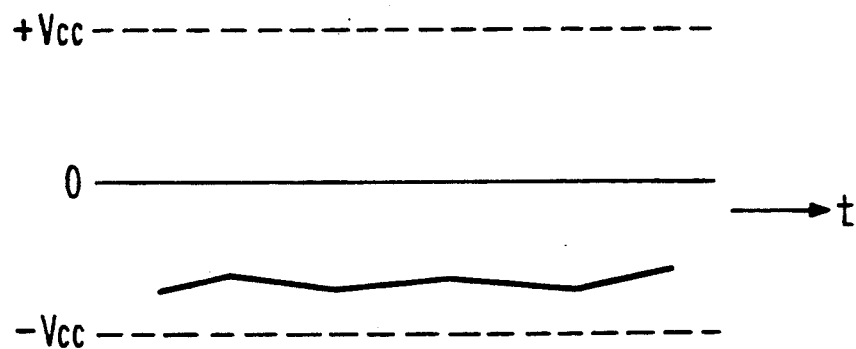

In the first case wherein the voltage-controlled oscillator 4 is in a sweep state, the control voltage input to the input terminal 4a of the voltage-controlled oscillator 4 is of a sawtooth waveform as shown in (a) of FIG. 3. Therefore, the output of the amplitude detector 6 is negative as shown in (b) of FIG. 3. Thus, the output of the second level detector 7 is LOW. Accordingly, the switching means 8 selects the terminal b to make the phase lock detection signal LOW, thereby causing the apparatus to stop operating.

In the second case wherein the output frequency of the voltage-controlled oscillator 4 deflects to the higher side of frequency than center frequency, the control voltage of the voltage-controlled oscillator 4 is a positive supply voltage. Accordingly, the output of the first level detector 5 is LOW, and the output of the amplitude detector 6 is 0 V. Therefore, the output of the second level detector 7 is HIGH. Accordingly, the switching means 8 selects the terminal a to make the phase lock detection signal LOW, and operation of the apparatus is stopped.

In the third case wherein the frequency of an output from the voltage-controlled oscillator 4 deflects to the lower side of frequency than center frequency, the control voltage of the voltage-controlled oscillator 4 is a negative supply voltage. Accordingly, the output of the first level detector 5 is HIGH, and the output of the amplitude detector 6 is negative. Therefore, the output of the second level detector 7 is LOW. Accordingly, the switching means 8 selects the terminal b to make the phase lock detection signal LOW, and operation of the apparatus is stopped. As described above, the phase lock detection signal is HIGH in a synchronous state, and is LOW in an asynchronous state.

Figure 4:
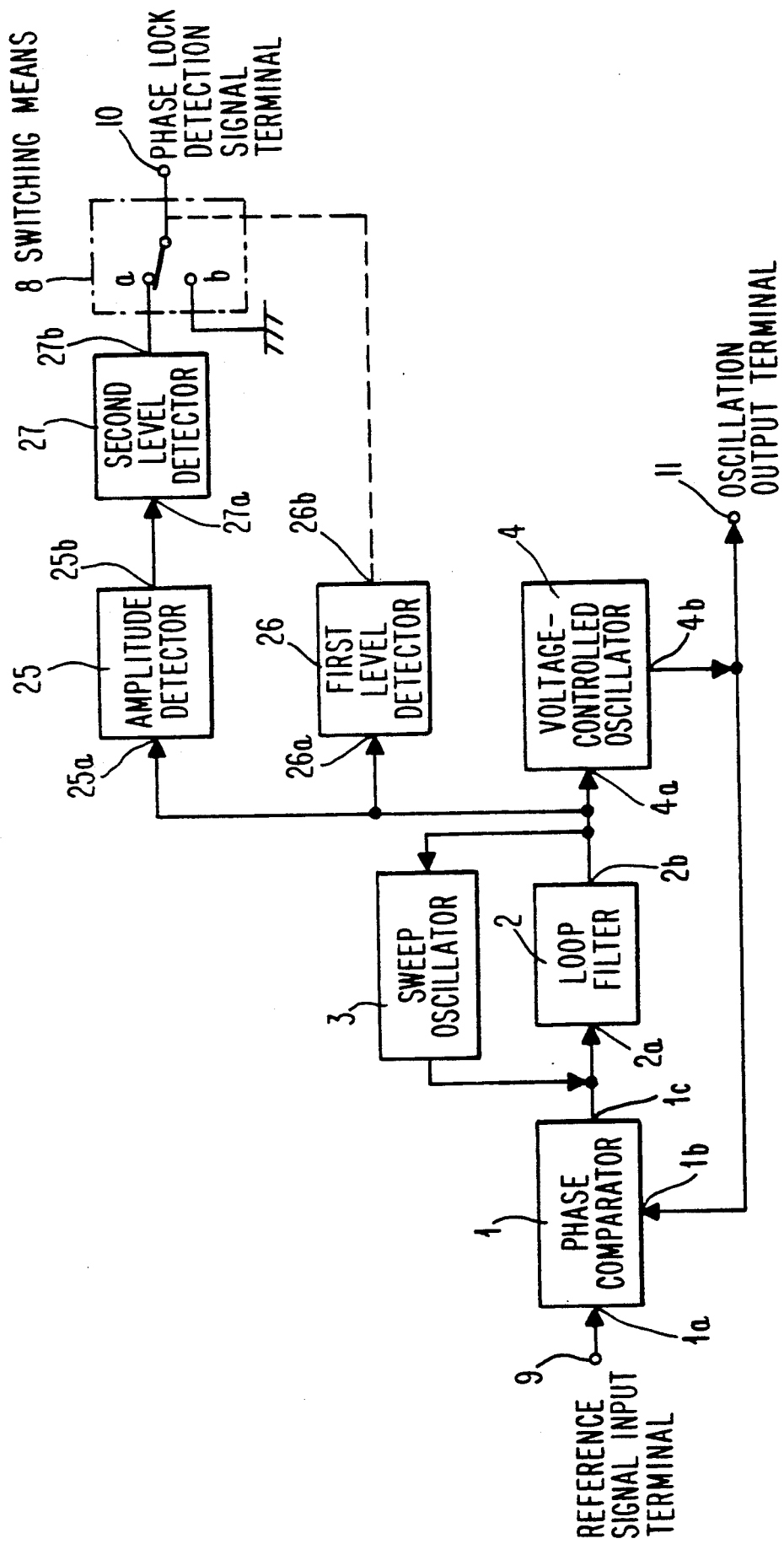
FIG. 4 is a block diagram showing a phase-locked oscillator representing a second embodiment of the invention.
Figure 5:
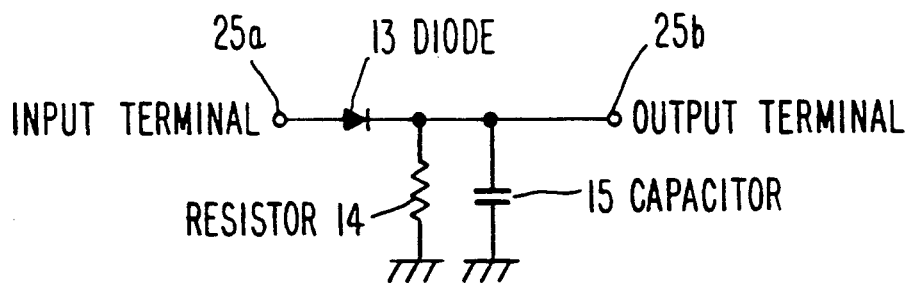
FIG. 5 is a circuit diagram showing an amplitude detector circuit employed in the phase-locked oscillator of the second embodiment of the invention.

A second embodiment of the invention is illustrated in FIG. 4 in which the parts same as those in FIG. 1 are designated by the same reference numerals. Numeral 26 designates a first level detector. When a signal input from the output terminal 2b of the loop filter 2 to the input terminal 4a of the voltage-controlled oscillator 4, that is, the control voltage is negative, the voltage applied to an input terminal 26a of the first level detector 26 is also negative, and, therefore, the first level detector 26 outputs a LOW signal from an output terminal 26b. When the input is 0 V or positive, the first level detector 26 outputs a HIGH signal. 25 is an amplitude detector which detects the amplitude of a positive voltage. The amplitude detector 25 is specifically shown in FIG. 5, in which 25a designates an input terminal, 13 designates a detecting diode, 14 designates a resistor, 15 designates a capacitor, and 25b designates an output terminal. 27 is a second level detector which outputs a LOW signal from an output terminal 27b when an input signal supplied to an input terminal 27a from the output terminal 25b of the amplitude detector 25 is a positive supply voltage, and a HIGH signal when the input signal is lower than the positive supply voltage. 8 is a switching means for selecting a LOW level (the terminal b) when the output from the first level detector 26 is LOW, and for selecting the output of the second level detector (the terminal a) when the output from the first level detector 26 is HIGH.

Then, the operation will be described. First, when the state is in a synchronous or phase-locked condition, the synchronous state is detected. Namely, since the state is in a synchronous condition, a control voltage input to the input terminal 4a of the voltage-controlled oscillator 4 attains a DC value between 0 V and the positive supply voltage, and accordingly the output of the second level detector 27 is HIGH. The output of the first level detector 26 is HIGH. Accordingly, the switching means 8 selects the terminal a so that the HIGH output of the second level detector 27 becomes a phase lock detection signal output from the phase lock detection signal terminal, and the apparatus continues to operate.

An asynchronous or out-of-phase state occurs in the following three cases: firstly when the voltage-controlled oscillator 4 is in a sweep state; secondly when the output frequency of the voltage-controlled oscillator 4 deflects toward the higher side of frequency than the center frequency; and thirdly when the output frequency of the voltage-controlled oscillator 4 deflects toward the lower side of frequency than the center frequency.

Figure 6A:
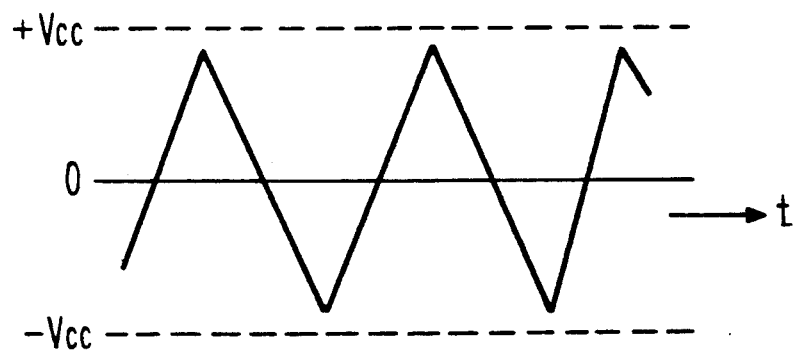
FIGS. 6a and 6b are waveform diagrams of input and output signals of the amplitude detector circuit employed in the phase-locked oscillator of the second embodiment of the invention.
Figure 6B:
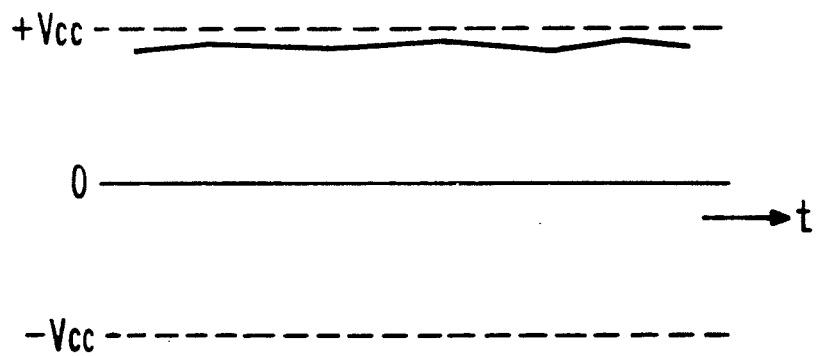
Figure 7:
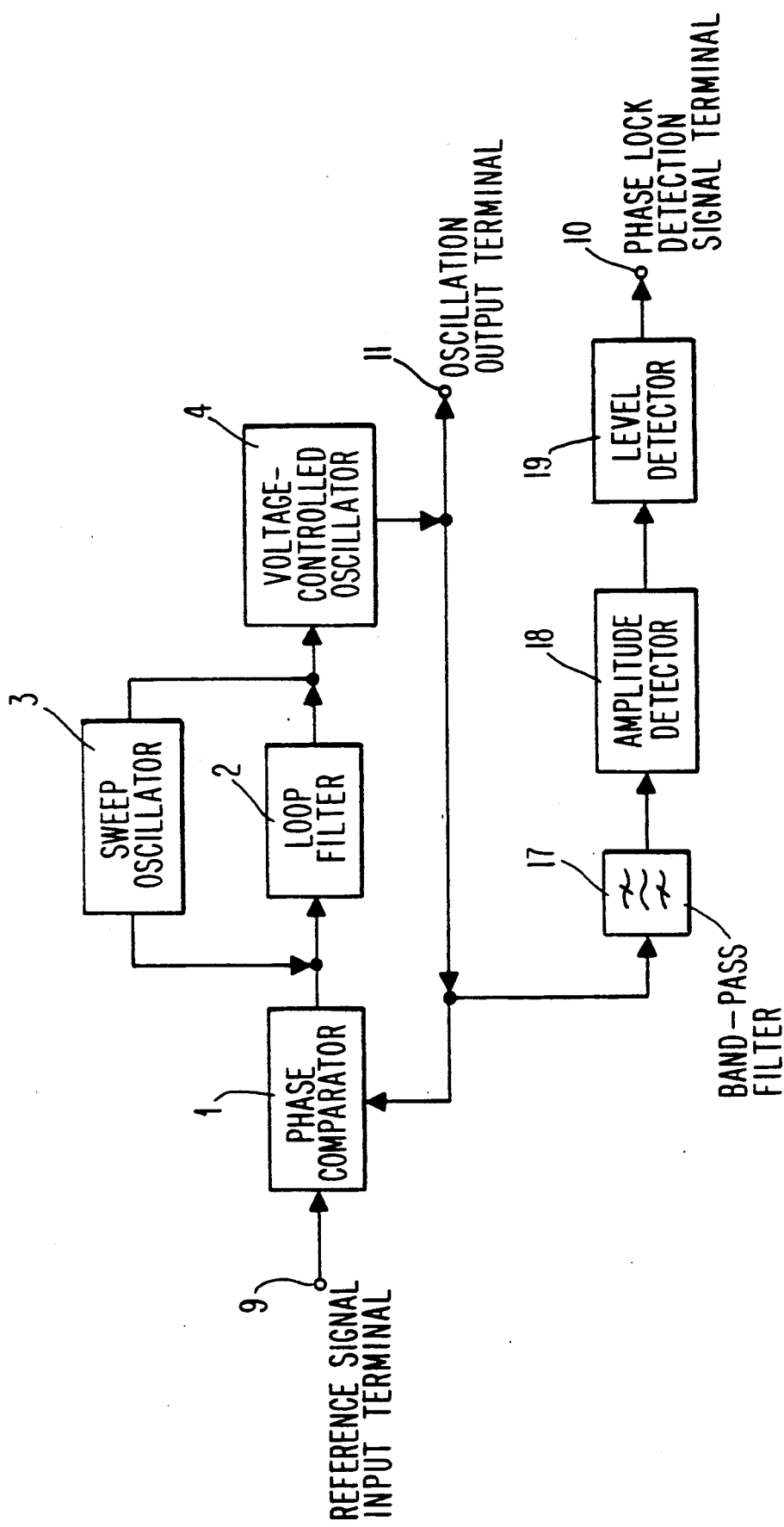
FIG. 7 is a block diagram showing a prior art phase-locked oscillator.

In the first case wherein the voltage-controlled oscillator 4 is in a sweep state, the control voltage input of the voltage-controlled oscillator 4 is of a sawtooth waveform as shown in (a) of FIG. 6. Therefore, the output of the amplitude detector 25 is positive as shown in (b) of FIG. 6. Thus, the output of the second level detector 27 is LOW. The first level detector 26 outputs alternately HIGH and LOW so that the switching means 8 selects reciprocally the terminals a and b. Since both the terminals a and b are LOW, the phase lock detection signal from the phase lock detection signal terminal 10 is LOW, thereby causing the apparatus to stop operating. In the switching means 8, the connection with either terminal a or b is surely maintained even at the moment of the switching.

In the second case wherein the output frequency of the voltage-controlled oscillator 4 deflects to the higher side of frequency than the center frequency, the control voltage of the voltage-controlled oscillator 4 is a positive supply voltage. Accordingly, the output of the amplitude detector 25 is a positive supply voltage. Therefore, the output of the second level detector 27 is LOW, and the output of the first level detector 26 is HIGH. Accordingly, the switching means 8 selects the terminal a to make the phase lock detection signal LOW.

In the third case wherein the frequency of an output from the voltage-controlled oscillator 4 deflects to the lower side of frequency than center frequency, the control voltage of the voltage-controlled oscillator 4 is a negative supply voltage. Accordingly, the output of the amplitude detector 25 is 0 V. Consequently, the output of the second level detector 27 is HIGH, and the output of the first level detector 26 is LOW. Therefore, the switching means 8 selects the terminal b to make the phase lock detection signal LOW. As seen from above, the signal is HIGH in a synchronous or phase lock state to allow the apparatus to continue the operation. On the other hand, in an asynchronous or out-of-phase state, the signal is low so that the phase lock detection signal for stopping the operation of the apparatus is obtained.

INDUSTRIAL APPLICABILITY

As described above, according to the present invention, the phase of the reference signal is compared with that of an output signal from the voltage-controlled oscillator, the phase-compared output is then input to the loop filter which in turn transmits its output to both the amplitude detector and the first level detector. The second level detector is connected to the amplitude detector. The switching means performs changes in its state to a first status or a second status according to the output of the first or second level detector, so that the output appearing at the phase lock detection signal terminal following the switching means is caused to be HIGH or LOW. In this way, phase shifting can be detected in terms of voltage, thereby enabling the detection of phase lock state to be conducted surely. Therefore, the phase locked oscillator according to the invention can be employed as a highly reliable local oscillator for a communication apparatus.

We claim:

1. A phase-locked oscillator comprising: a reference signal input terminal; a phase comparator, a first input terminal of said phase comparator being connected to said reference signal input terminal; a loop filter, an input terminal of said loop filter being connected to an output terminal of said phase comparator; a sweep oscillator connected between an output terminal of said loop filter and said input terminal of said loop filter; a voltage-controlled oscillator, an input terminal of said voltage-controlled oscillator being connected to said output terminal of said loop filter; an oscillation output terminal connected to an output terminal of said voltage-controlled oscillator; a connecting means for connecting said oscillation output terminal with a second input terminal of said phase comparator; a first level detector and an amplitude detector, an input terminal of each of said first level detector and amplitude detector being connected to said output terminal of said loop filter; a second level detector, an input terminal of said second level detector being connected to an output terminal of said amplitude detector; and a switching means for switching the state between first and second states in accordance with the output of said second level detector, said switching means connecting an output terminal of said first level detector to a phase lock detection signal terminal when said switching means switches the state to said first state, and connecting said phase lock detection signal terminal to ground when said switching means switches the state to said second state.

2. A phase-locked oscillator comprising: a reference signal input terminal; a phase comparator, a first input terminal of said phase comparator being connected to said reference signal input terminal; a loop filter, an input terminal of said loop filter being connected to an output terminal of said phase comparator; a sweep oscillator connected between an output terminal of said loop filter and said input terminal of said loop filter; a voltage-controlled oscillator, an input terminal of said voltage-controlled oscillator being connected to said output terminal of said loop filter; an oscillation output terminal connected to an output terminal of said voltage-controlled oscillator; a connecting means for connecting said oscillation output terminal with a second input terminal of said phase comparator; a first level detector and an amplitude detector, an input terminal of each of said first level detector and amplitude detector being connected to said output terminal of said loop filter; a second level detector, an input terminal of said second level detector being connected to an output terminal of said amplitude detector; and a switching means for switching the state between first and second states in accordance with the output of said first level detector, said switching means connecting an output terminal of said first level detector to a phase lock detection signal terminal when said switching means switches the state to said first state, and connecting said phase lock detection signal terminal to ground when said switching means switches the state to said second state.

* * * * *